(12) United States Patent
Lin et al.

(10) Patent No.: US 9,190,612 B1
(45) Date of Patent: Nov. 17, 2015

(54) SEMICONDUCTOR STRUCTURE, RESISTIVE RANDOM ACCESS MEMORY UNIT STRUCTURE, AND MANUFACTURING METHOD OF THE SEMICONDUCTOR STRUCTURE

(71) Applicant: Macronix International Co., Ltd., Hsinchu (TW)

(72) Inventors: Yu-Yu Lin, New Taipei (TW); Feng-Min Lee, Changhua County (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/297,689

(22) Filed: Jun. 6, 2014

(51) Int. Cl.
*H01L 23/52* (2006.01)
*H01L 45/00* (2006.01)

(52) U.S. Cl.
CPC .......... *H01L 45/1233* (2013.01); *H01L 45/08* (2013.01); *H01L 45/145* (2013.01)

(58) Field of Classification Search
CPC .................................................. H01L 45/1233
USPC .......................................................... 257/211
See application file for complete search history.

(56) References Cited

U.S. PATENT DOCUMENTS

| 7,382,647 B1 * | 6/2008 | Gopalakrishnan ............ 365/163 |
| 8,134,139 B2 * | 3/2012 | Lin et al. .............................. 257/4 |
| 2011/0155990 A1 * | 6/2011 | Cheung et al. ..................... 257/3 |
| 2011/0194339 A1 * | 8/2011 | Kozicki ......................... 365/163 |
| 2014/0264232 A1 * | 9/2014 | Lee et al. ............................ 257/4 |

* cited by examiner

*Primary Examiner* — Anthony Ho
(74) *Attorney, Agent, or Firm* — McClure, Qualey & Rodack, LLP (57) ABSTRACT

A semiconductor structure, a resistive random access memory unit structure, and a manufacturing method of the semiconductor structure are provided. The semiconductor structure includes an insulating structure, a stop layer, a metal oxide layer, a resistance structure, and an electrode material layer. The insulating structure has a via, and the stop layer is formed in the via. The metal oxide layer is formed on the stop layer. The resistance structure is formed at a bottom of an outer wall of the metal oxide layer. The electrode material layer is formed on the metal oxide layer.

12 Claims, 11 Drawing Sheets

SEMICONDUCTOR STRUCTURE, RESISTIVE RANDOM ACCESS MEMORY UNIT STRUCTURE, AND MANUFACTURING METHOD OF THE SEMICONDUCTOR STRUCTURE

BACKGROUND

1. Technical Field

The present disclosure relates in general to a semiconductor structure, a resistive random access memory unit structure, and a manufacturing method of the semiconductor structure, and more particularly to a semiconductor structure having excellent characteristics, a resistive random access memory unit structure, and a manufacturing method of the semiconductor structure.

2. Description of the Related Art

With the development of semiconductor technology, various semiconductor elements are invented. For example, memories, transistors, and diodes are widely used in various types of electronic devices.

In the development of memory technology, researchers have been trying to make a variety of types of developments and improvements, and resistive memory is one of the types. Therefore, researchers have been working on providing resistive memories of which the resistance values can be nicely controlled for achieving excellent characteristics.

SUMMARY

The present disclosure is directed to a semiconductor structure, a resistive random access memory unit structure, and a manufacturing method of the semiconductor structure. In the embodiments, the stop layer of the semiconductor structure can stop the over-oxidation in the oxidation process, and accordingly, the semiconductor structure is provided with improved characteristics.

According to an embodiment of the present disclosure, a semiconductor structure is provided. The semiconductor structure includes an insulating structure, a stop layer, a metal oxide layer, a resistance structure, and an electrode material layer. The insulating structure has a via, and the stop layer is formed in the via. The metal oxide layer is formed on the stop layer. The resistance structure is formed at a bottom of an outer wall of the metal oxide layer. The electrode material layer is formed on the metal oxide layer.

According to another embodiment of the present disclosure, a resistive random access memory unit structure is provided. The resistive random access memory unit structure includes an insulating structure, a stop layer, a memory element, a resistance structure, and a top electrode layer. The insulating structure has a via, and the stop layer is formed in the via. The memory element is formed on the stop layer. The resistance structure is formed at a bottom of an outer wall of the memory element. The top electrode layer is formed on the memory element.

According to a further embodiment of the present disclosure, a manufacturing method of a semiconductor structure is provided. The manufacturing method of the semiconductor structure includes the following steps: forming an insulating structure having a via; forming a stop layer in the via and on a sidewall of the via; forming a metal layer on the stop layer; removing a portion of the stop layer on the sidewall of the via; performing an oxidation process for oxidizing the metal layer for forming a metal oxide layer on the stop layer and for forming a resistance structure at a bottom of an outer wall of the metal oxide layer; and forming an electrode material layer on the metal oxide layer.

The above and other embodiments of the disclosure will become better understood with regard to the following detailed description of the non-limiting embodiment(s). The following description is made with reference to the accompanying drawings.

DETAILED DESCRIPTION

According to the embodiments of the present disclosure, a semiconductor structure, a resistive random access memory unit structure, and a manufacturing method of the semiconductor structure are provided. In the embodiments, the stop layer of the semiconductor structure can stop the over-oxidation in the oxidation process, and accordingly, the semiconductor structure is provided with improved characteristics. The following embodiments are for the purpose of elaboration only, not for limiting the scope of protection of the invention. Besides, secondary elements are omitted in the following embodiments to highlight the technical features of the invention.

Figure 1:
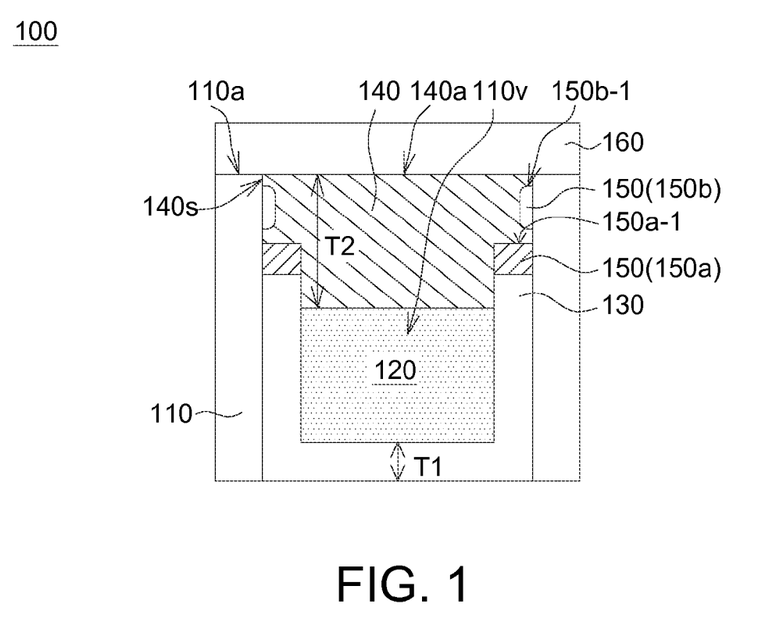
FIG. 1 shows a cross-sectional view of a semiconductor structure according to an embodiment of the present disclosure.

FIG. 1 shows a cross-sectional view of a semiconductor structure 100 according to an embodiment of the present disclosure. The semiconductor structure 100 includes an insulating structure 110, a stop layer 130, a metal oxide layer 140, a resistance structure 150, and an electrode material layer 160. The insulating structure 110 has a via 110v, and the stop layer 130 is formed in the via 110v. The metal oxide layer 140 is formed on the stop layer 130. The resistance structure 150 is formed at a bottom of an outer wall 140s of the metal oxide layer 140. The electrode material layer 160 is formed on the metal oxide layer 140.

In the embodiment, the material of the insulating structure 110 may include an insulating material, such as silicon nitride (SiN) or silicon oxide. However, the selections of the materials of the insulating structure 110 may vary depending on actual needs and are not limited thereto.

In the embodiment, the stop layer 130 has properties of high conductivity and resistance to oxidation, therefore, the stop layer 130 can be used for stopping an over-oxidation in the oxidation process of the metal oxide layer 140, such as preventing other components of the semiconductor structure 100 from being oxidized by the oxidation process, and accordingly, the semiconductor structure 100 is provided with improved characteristics.

In the embodiment, the stop layer 130 may include at least one of a metal nitride or an inert metal. For example, the material of the stop layer 130 may include at least one of TiN, TaN, WN, Au, or Pt. However, the selections of the material (s) of the stop layer 130 may vary according to actual needs and are not limited thereto.

In the embodiment, the thickness T1 of the stop layer 130 is such as about 200-300 Å, and the thickness T2 of the metal oxide layer 140 is such as about 100-400 Å.

In the embodiment, the material of the metal oxide layer 140 may include at least one of $WO_x$, TiN, TaN or $HfO_2$.

In the embodiment, the semiconductor structure 100 may further include a conductive structure 120. As shown in FIG. 1, the conductive structure 120 is formed between the stop layer 130 and the metal oxide layer 140. The material of the conductive structure 120 may include a conductive material, such as tungsten metal (W). However, the selections of the materials of the conductive structure 120 may vary depending on actual needs and are not limited thereto.

According to the embodiments of the present disclosure, as shown in FIG. 1, the resistance structure 150 is formed at the bottom of the outer wall 140s of the metal oxide layer 140. In other words, the top surface of the resistance structure 150 is below the top surface 140a of the metal oxide layer 140. Further speaking, the resistance structure 150 with high resistance may be formed between the outer wall 140s of the metal oxide 140 and the sidewall 110s of the via 110v, such that a better insulation between the electrode material layer 160 and other conductive components located below the resistance structure 150 is provided, and the short circuit between the other conductive components and the electrode material layer 160 can be further prevented. For example, the resistance structure 150 with high resistance can provide a better insulation between the conductive structure 120 and the electrode material layer 160, and the short circuit between the conductive structure 120 and the electrode material layer 160 can be further prevented.

As shown in FIG. 1, the resistance structure 150 may include at least one of a metal oxide structure 150a or a void 150b. In other words, the resistance structure 150 may include the metal oxide structure 150a, the void 150b, or both of the metal oxide structure 150a and the void 150b. In the embodiment, the top surface 150a-1 of the metal oxide structure 150a and the top surface 150b-1 of the void 150b are both below the top surface 140a of the metal oxide layer 140. In the embodiment, the metal oxide structure 150a may be any type(s) of metal oxide having high resistance, such as titanium oxynitride (TiON); the void 150b may be an air gap having high resistance. However, the type(s) of the resistance structure 150 may vary according to actual needs and are not limited thereto.

In the embodiment, the material of the electrode material layer 160 includes a conductive material, such as at least one of W, Pt, TaN, or nickel (Ni). However, the selections of the material of the electrode material layer 160 may vary according to actual needs, as long as the material can be used as electrodes, and are not limited thereto.

Figure 2:
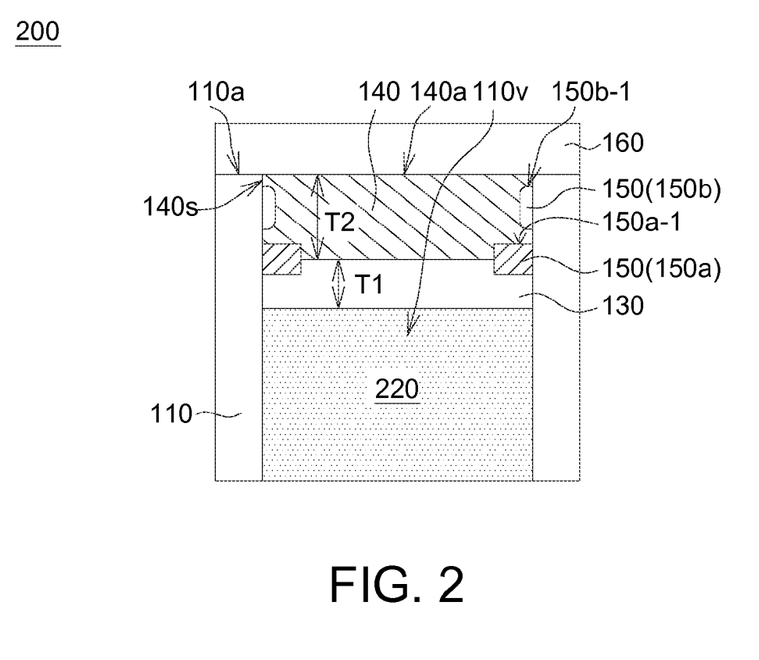
FIG. 2 shows a cross-sectional view of a semiconductor structure according to another embodiment of the present disclosure.

FIG. 2 shows a cross-sectional view of a semiconductor structure 200 according to another embodiment of the present disclosure. The elements in the present embodiment sharing the same labels with those in the previous embodiment are the same elements, and the description of which is omitted.

As shown in FIG. 2, the semiconductor structure 200 includes the insulating structure 110, a conductive structure 220, the stop layer 130, the metal oxide layer 140, the resistance structure 150, and the electrode material layer 160. The insulating structure 110 has a via 110v, and the conductive structure 220 is formed in the via 110v. The resistance structure 150 is formed at the bottom of the outer wall 140s of the metal oxide layer 140. The electrode material layer 160 is formed on the metal oxide layer 140.

In the embodiment, the material of the conductive structure 220 may include a conductive material, such as tungsten metal (W). However, the selections of the materials of the conductive structure 220 may vary depending on actual needs and are not limited thereto.

In the embodiment, the stop layer 130 has properties of high conductivity and resistance to oxidation, therefore, the stop layer 130 can be used for stopping an over-oxidation in the oxidation process of the metal oxide layer 140, such as preventing the conductive structure 220 from being oxidized by the oxidation process, such that the thickness of the metal oxide layer 140 has an improved uniformity, and accordingly, the semiconductor structure 200 is provided with improved characteristics. Moreover, the stop layer 130 may increase the adhesion between the metal oxide layer 140 and the conductive structure 220.

In one embodiment, the material of the stop layer 130 is TiN, as such, the adhesion between the conductive structure 220 made of tungsten (W) and the metal oxide layer 140 made of tungsten oxide ($WO_x$) is increased.

According to the embodiments of the present disclosure, as shown in FIG. 2, the resistance structure 150 is formed at the bottom of the outer wall 140s of the metal oxide layer 140. Further speaking, the resistance structure 150 with high resistance may be formed between the outer wall 140s of the metal oxide layer 140 and the sidewall 110s of the via 110v, such that a better insulation between the conductive structure 220 and the electrode material layer 160 is provided, and the short circuit between the conductive structure 220 and the electrode material layer 160 can be further prevented.

In the embodiment, the semiconductor structure 200 may further include a liner layer (not shown in drawings) formed between the conductive structure 220 and the insulating structure 110. In the embodiment, the material of the liner layer may include TiN.

Figure 3:
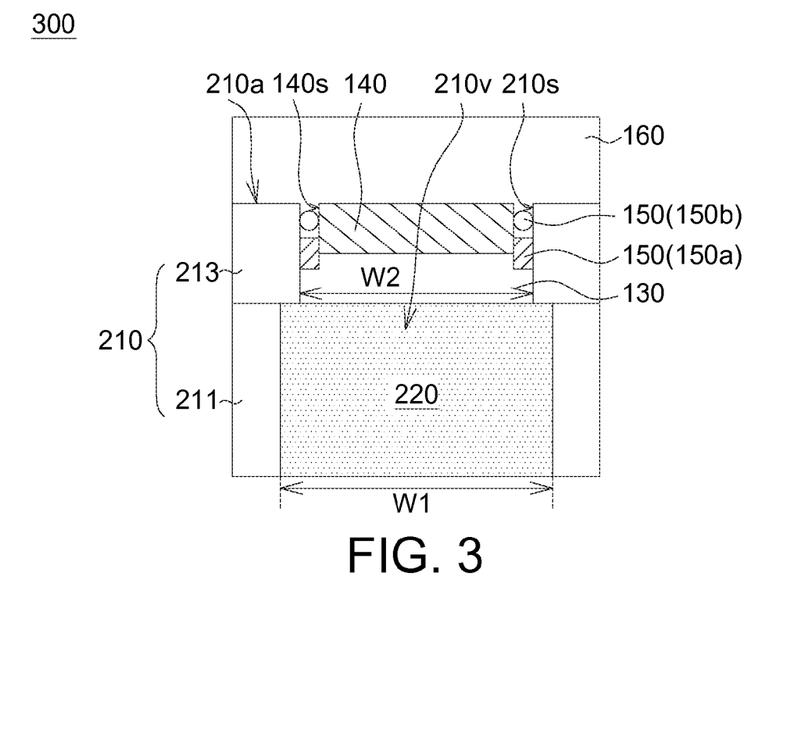
FIG. 3 shows a cross-sectional view of a semiconductor structure according to a further embodiment of the present disclosure.

FIG. 3 shows a cross-sectional view of a semiconductor structure 300 according to a further embodiment of the present disclosure. The elements in the present embodiment sharing the same labels with those in the previous embodiment are the same elements, and the description of which is omitted.

As shown in FIG. 3, the semiconductor structure 300 includes an insulating structure 120, the conductive structure 220, the stop layer 130, the metal oxide layer 140, the resistance structure 150, and the electrode material layer 160. In insulating structure 220 has a via 210v, and the conductive structure 220 is formed in the via 210v. The stop layer 130 is formed on the conductive structure 120, and the metal oxide layer 140 is formed on the stop layer 130. The resistance structure 150 is formed at the bottom of the outer wall 140s of the metal oxide layer 140. The electrode material layer 160 is formed on the metal oxide layer 140. As shown in FIG. 3, the resistance structure 150 may include at least one of the metal oxide structure 150a or the void 150b.

In the embodiment, as shown in FIG. 3, the insulating structure 210 may include a spacer wall 211 and an interlayer dielectric layer 213. The spacer wall 211 surrounds the conductive structure 220, and the interlayer dielectric layer 213 is formed on the spacer wall 211. The spacer wall 211 together with the interlayer dielectric layer 213 forms the via 210v.

The via 210v has a first width W1 corresponding to the spacer wall 211, and the via 210v has a second width W2 corresponding to the interlayer dielectric layer 213. The first width W1 and the second width W2 may be either the same or different from each other. In one embodiment, as shown in FIG. 2, the first width W1 is larger than the second width W2. In other embodiments, the first width W1 may be equal to or smaller than the second width W2.

In the embodiment, the semiconductor structure 300 may further include a liner layer (not shown in drawings) formed between the conductive structure 220 and the insulating structure 210, for example, between the conductive structure 220 and the spacer wall 211. In the embodiment, the material of the liner layer may include TiN.

According to the embodiments of the present disclosure, the semiconductor structure 100/200/300 may be, for example, a contact-type resistive random access memory unit structure. In such case, the conductive structure 120/200 is such as a contact structure, the metal oxide layer 140 is such as a memory element, and the electrode material layer 160 is such as a top electrode layer. For example, the contact structure, the memory element, and the top electrode layer may construct a multi-layered memory unit structure of metal/insulating layer/metal. The resistance value of the multi-layered structure can be changed by applying an external bias, such that the memory element may have a high resistance state and a low resistance state for representing digital signals of "0" and "1", respectively, for performing writing and erasing functions of the memory unit structure. Specifically speaking, when an external bias is applied, conduction path filaments are formed in the insulating layer of the multi-layered memory unit structure of metal/insulating layer/metal, turning the memory element into having a low resistance state. After currents pass, the conduction path filaments break, which turns the memory element into having a high resistance state.

When the thickness of the metal oxide layer 140 has an excellent uniformity, the insulating layer of the memory element has a high uniformity, such that the resistance of the memory element can be better controlled, and accordingly, the contact-type resistive random access memory unit structure is provided with better characteristics.

Referring to FIGS. 4A-4D, a manufacturing method of the semiconductor structure 100 according to an embodiment of the disclosure is illustrated.

Figure 4A:
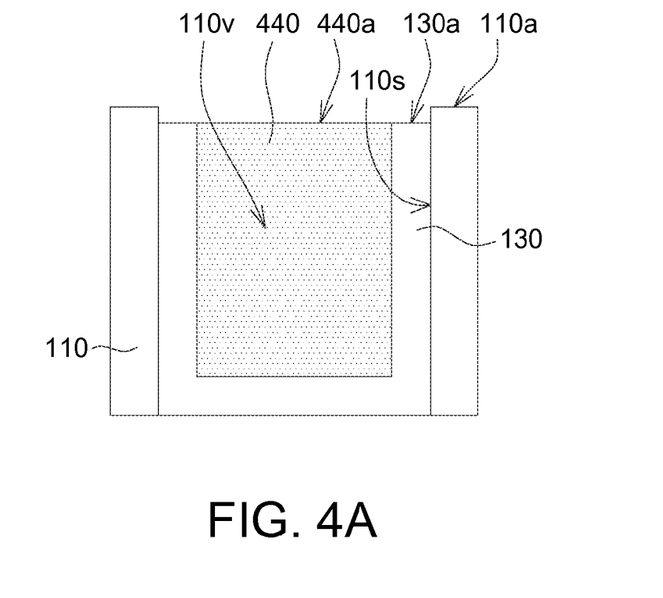
FIGS. 4A-4D illustrate a manufacturing method of a semiconductor structure according to an embodiment of the disclosure.

As shown in FIG. 4A, the insulating structure 110 having the via 110v is formed, the stop layer 130 is formed in the via 110v, and a metal layer 440 is formed on the stop layer 130. In the embodiment, the stop layer 130 is formed on the sidewall 110s of the via 110v. In the embodiment, for example, the stop layer 130 and the metal layer 440 are formed and filled in the via 110v.

In the embodiment, a planarization process is further performed on the stop layer 130 and the metal layer 440 for planarizing the surfaces of the stop layer 130 and the metal layer 440. In the embodiment, the planarization process is such as a CMP process. After the planarization, as shown in FIG. 4A, the top surface 130a of the stop layer 130 and the top surface 440a of the metal layer 440 are coplanar and aligned with each other. After the planarization process, the top surface 130a of the stop layer 130 and the top surface 440a of the metal layer 440 may be either coplanar and aligned with the top surface 110a of the insulating structure 110, or non-coplanar with the top surface 110a. In the embodiment, as shown in FIG. 4A, the top surface 130a and the top surface 440a are not coplanar with the top surface 110a.

Figure 4B:
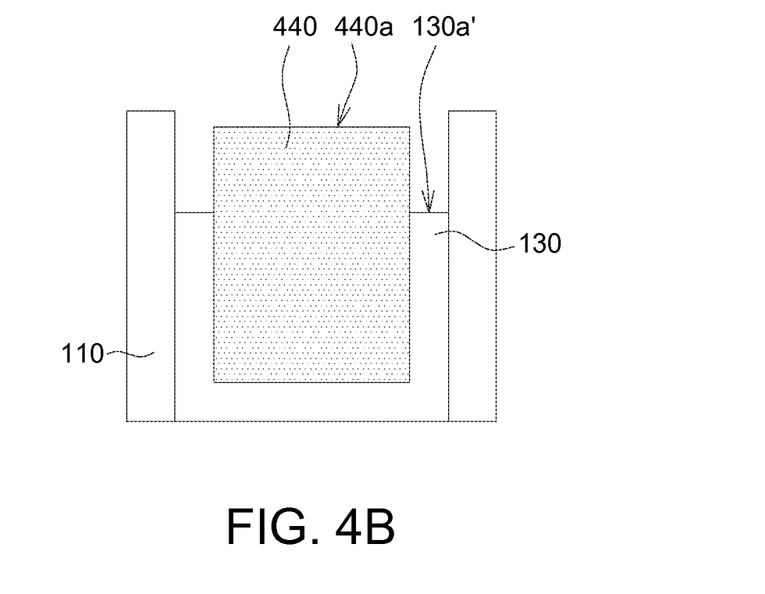

As shown in FIG. 4B, a portion of the stop layer 130 located on the sidewall 110s of the via 110v is removed. After the step, the top surface 130a' of the stop layer 130 and the top surface 440a of the metal layer 440 are non-coplanar. In the embodiment, the portion of the stop layer 130 is removed by such as an etching process using an etchant having a high selectivity to the stop layer 130 and the metal layer 440, such that only the stop layer 130 is partially removed, and the structure of the metal layer 440 is not substantially damaged by the etching process.

Figure 4C:
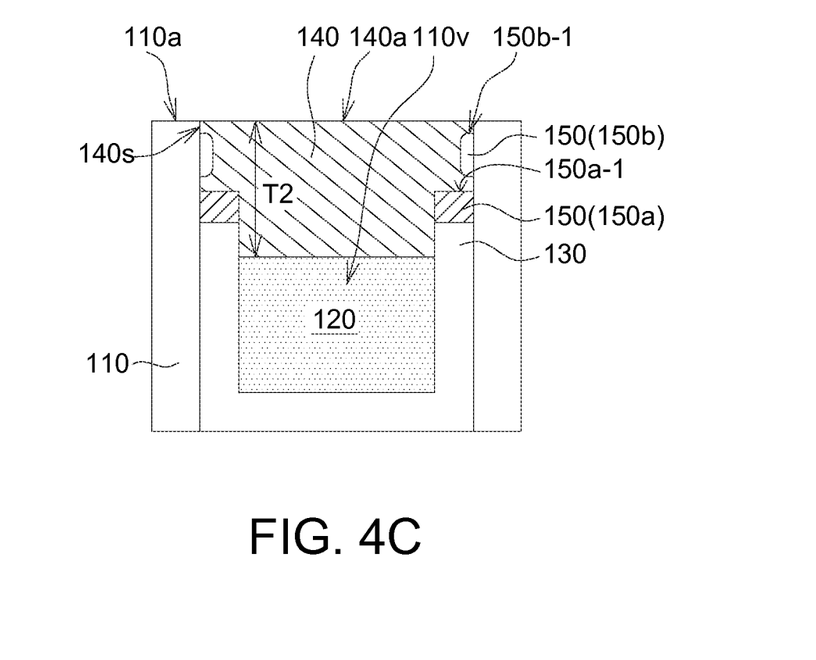

As shown in FIG. 4C, an oxidation process is performed for oxidizing the metal layer 440 for forming the metal oxide layer 140 on the stop layer 130 and for forming the resistance structure 150 at the bottom of the outer wall 140s of the metal oxide layer 140. In the embodiment, a portion of the metal layer 440 is oxidized to form the metal oxide layer 140, and the un-oxidized portion of the metal layer 440 forms the conductive structure 120.

Figure 4D:
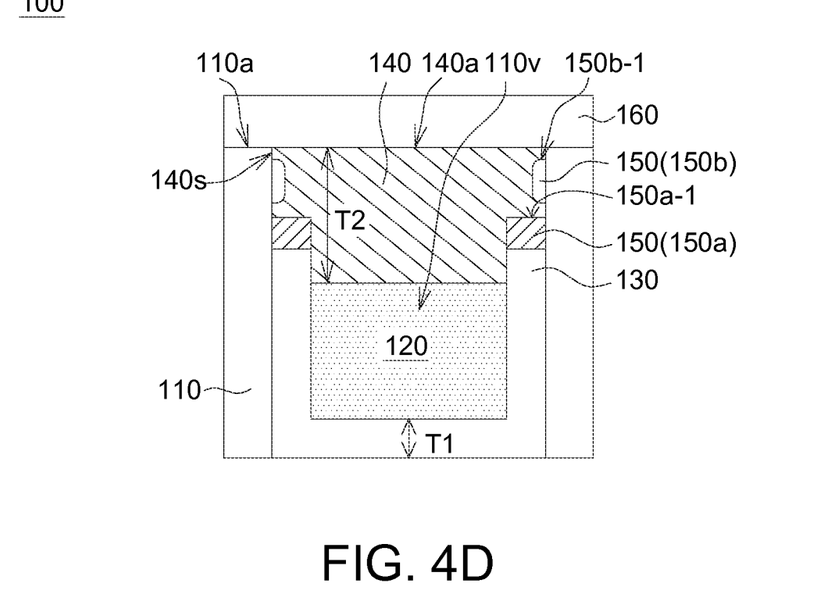

As shown in FIG. 4D, the electrode material layer 160 is formed on the metal oxide layer 140. As such, the semiconductor structure 100 as shown in FIG. 4D (FIG. 1) is formed.

In the oxidation process, the metal layer 440 is oxidized and expands in volume, and the metal oxide layer 140 as shown in FIG. 4D is thus formed, wherein the outer wall 140s of the expanded metal oxide layer 140 extends towards the sidewall 110s of the via 110v. In addition, the resistance structure 150, such as the void 150b, may be formed between the outer wall 140s of the metal oxide layer 140 and the sidewall 110s of the via 110v. In the embodiment, for example, the void 150b is formed at the bottom of the outer wall 140s of the metal oxide layer 140. In the present step, since the top surface 130a' of the stop layer 130 is below the top surface 440a of the metal layer 440, therefore, the top surface 150b-1 of the as-formed void 150b is below the top surface 140a of the metal oxide layer 140.

In the embodiment, the oxidation process may be such as a plasma oxidation process, a rapid thermal oxidation process, or a photo-chemical oxidation process. However, the selections of the type of the oxidation process may vary according to actual needs and are not limited thereto.

Moreover, in the oxidation process, an exposed portion of the stop layer 130 may be oxidized as well for forming the resistance structure 150, such as the metal oxide structure 150a. For example, a portion of the surface of the stop layer 130 exposed from the metal layer 440 may be oxidized in the oxidation process for forming the metal oxide structure 150a. In the embodiment, the material of the metal oxide structure 150a may include, for example, the oxide of the stop layer 130. For example, when the material of the stop layer 130 is TiN, and then the material of the metal oxide structure 150a may include TiON. In the present step, since the top surface 130a' of the stop layer 130 is below the top surface 440a of the metal layer 440, therefore, the top surface 150a-1 of the as-formed metal oxide structure 150a is below the top surface 140a of the metal oxide layer 140.

Referring to FIGS. 5A-5F, a manufacturing method of the semiconductor structure 200 according to another embodiment of the disclosure is illustrated.

Figure 5A:
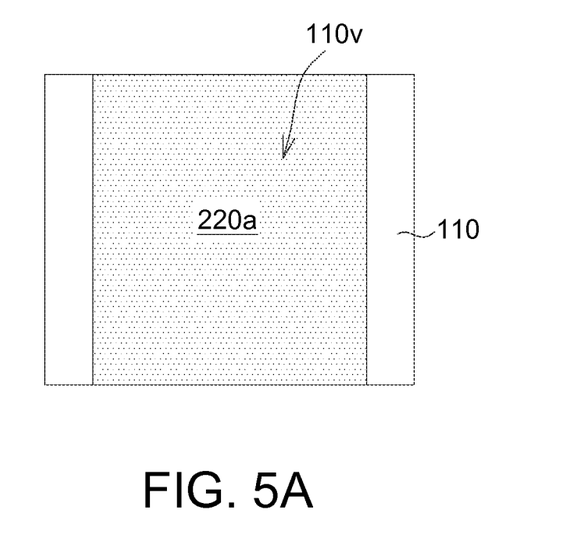
FIGS. 5A-5F illustrate a manufacturing method of a semiconductor structure according to another embodiment of the disclosure.
Figure 5B:
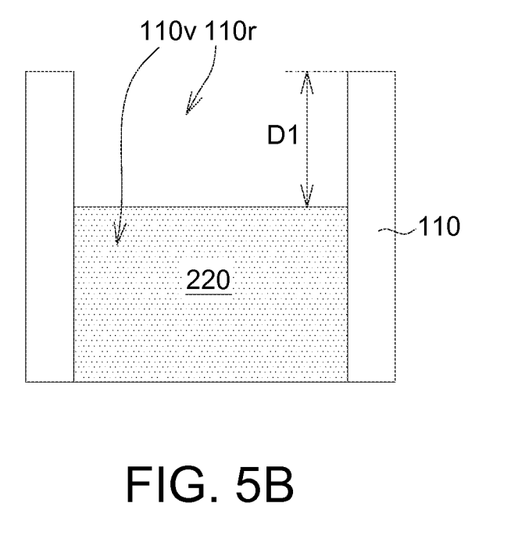

As shown in FIGS. 5A-5B, the insulating structure 110 having the via 110v is formed, and the conductive structure 220 is formed in the via 110v. The manufacturing method of forming the conductive structure 220 in the via 110v includes such as the following steps.

As shown in FIG. 5A, a conductive material layer 220a is filled in the via 110v. Next, as shown in FIG. 5B, a portion of the conductive material layer 220a is removed for forming the conductive structure 220 in the via 110v and exposing an upper portion 110r of the via 110v. In other words, the conductive structure 220 is not filled up to the upper portion 110r of the via 110v.

In the embodiment, a liner layer (not shown in drawings) may be optionally formed between the conductive material layer 220a and the insulating structure 110. For example, the liner layer is formed on the inner sidewalls of the insulating structure 110, followed by forming the conductive material layer 220a on the liner layer. In the present embodiment, a portion of the liner layer is removed while a portion of the conductive material layer 220a is removed; such that the remained liner layer is only located between the conductive structure 220 and the insulating structure 110.

In the embodiment, the portion of the conductive material layer 220a is removed by such as an etching process. After the removal, the conductive structure 220 and the upper portion 110r without the conductive structure 220 filled therein remain. As shown in FIG. 5B, the upper portion 110r is presented as a recess. In the embodiment, the recess formed from the upper portion 110r has a depth D1 which is about the sum of the thicknesses of the stop layer and the metal oxide layer formed in the subsequent steps, for example, the depth D1 may be 300-700 Å. However, the depth D1 may vary according to actual needs, such as requirements of resistance or other characteristics of elements, and is not limited thereto.

Figure 5C:
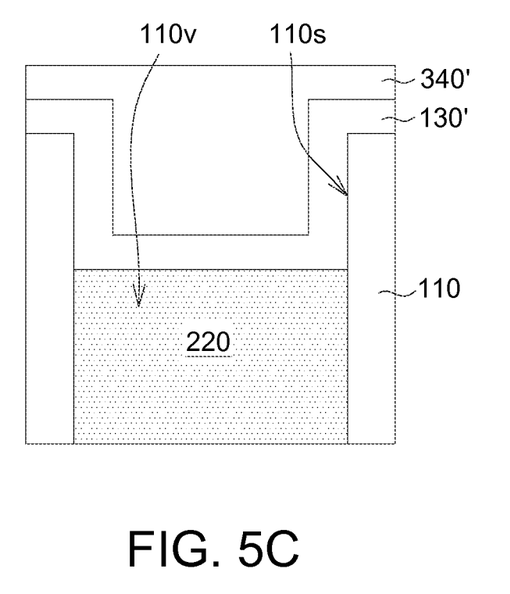

As shown in FIG. 5C, a stop layer 130' is formed on the conductive structure 220 and on the sidewall 110s of the via 110v, and a metal layer 340' is formed on the stop layer 130'. In the embodiment, for example, the stop layer 130' and the metal layer 340' are formed and filled in the recess formed from the upper portion 110r of the via 110v.

Figure 5D:
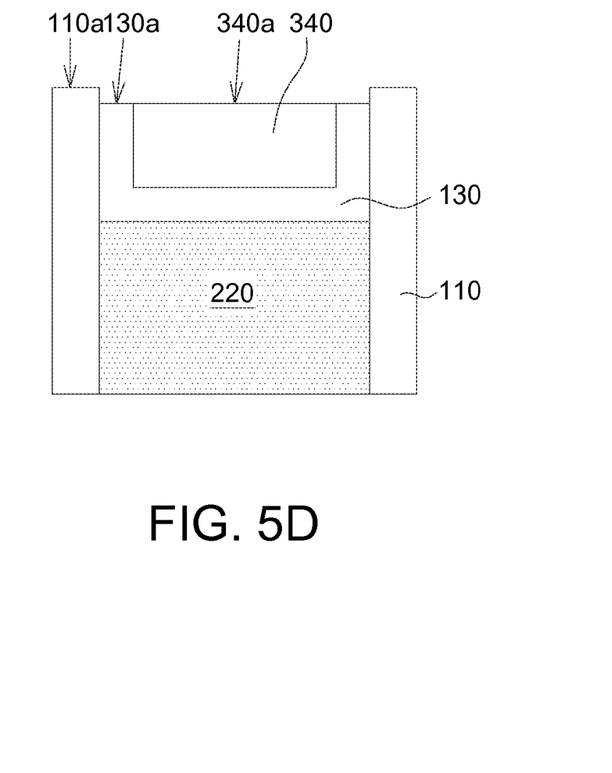

As shown in FIG. 5D, a planarization process is performed on the stop layer 130' and the metal layer 340' for planarizing the surfaces of the stop layer 130' and the metal layer 340', for forming the stop layer 130 and the metal layer 340. In the embodiment, the planarization process is such as a CMP process. After the planarization, as shown in FIG. 5D, the top surface 130a of the stop layer 130 and the top surface 340a of the metal layer 340 are coplanar and aligned with each other. After the planarization process, the top surface 130a of the stop layer 130 and the top surface 340a of the metal layer 340 may be either coplanar and aligned with the top surface 110a of the insulating structure 110 or non-coplanar with the top surface 110a. In the embodiment, as shown in FIG. 5D, the top surface 130a and the top surface 340a are not coplanar with the top surface 110a.

Figure 5E:
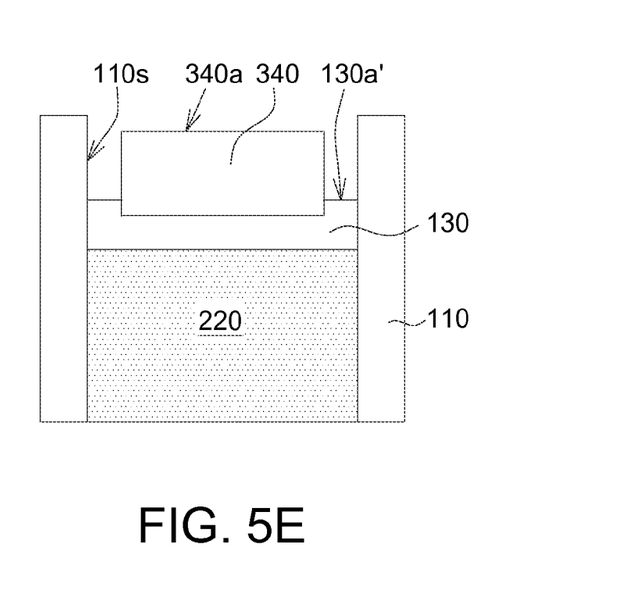

As shown in FIG. 5E, a portion of the stop layer 130 located on the sidewall 110s of the via 110v is removed. After the step, the top surface 130a' of the stop layer 130 and the top surface 340a of the metal layer 340 are non-coplanar. In the embodiment, the portion of the stop layer 130 is removed by such as an etching process using an etchant having a high selectivity to the stop layer 130 and the metal layer 340, such that only the stop layer 130 is partially removed, and the structure of the metal layer 340 is not substantially damaged by the etching process.

Figure 5F:
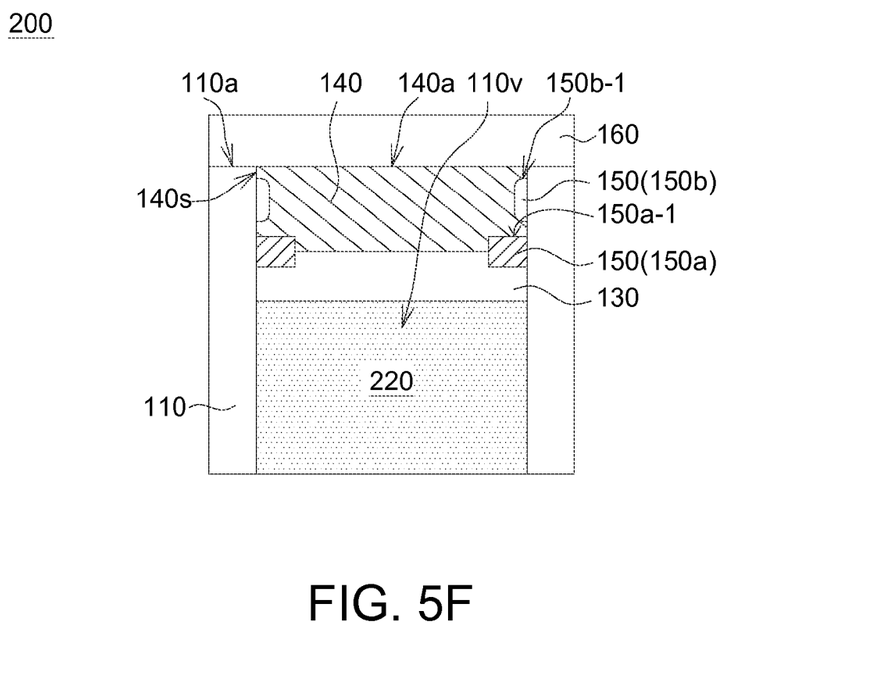

As shown in FIG. 5F, an oxidation process is performed for oxidizing the metal layer 340 for forming the metal oxide layer 140 on the stop layer 130 and for forming the resistance structure 150 at the bottom of the outer wall 140s of the metal oxide layer 140, and the electrode material layer 160 is formed on the metal oxide layer 140. In the embodiment, since the stop layer 130 can prevent oxygen from penetrating through, such that the oxidation of the metal layer 340 can be stopped on top of the stop layer 130, and the oxidation does not extend downwards to the conductive structure 220. As such, the thickness of the metal oxide layer 140 can be better controlled, and the thickness of the metal oxide layer 140 is more uniform.

In the embodiment, as shown in FIG. 5F, the electrode material layer 160 may be formed on the top surface 110a of the insulating structure 110 as well.

In the oxidation process, the metal layer 340 is oxidized and expands in volume, and the metal oxide layer 140 as shown in FIG. 5F is thus formed, wherein the outer wall 140s of the expanded metal oxide layer 140 extends towards the sidewall 110s of the via 110v. In addition, the resistance structure 150, such as the void 150b, may be formed between the outer wall 140s of the metal oxide layer 140 and the sidewall 110s of the via 110v. In the embodiment, for example, the void 150b is formed at the bottom of the outer wall 140s of the metal oxide layer 140. In the present step, since the top surface 130a' of the stop layer 130 is below the top surface 340a of the metal layer 340, therefore, the top surface 150b-1 of the as-formed void 150b is below the top surface 140a of the metal oxide layer 140.

Moreover, in the oxidation process, an exposed portion of the stop layer 130 may be oxidized as well for forming the resistance structure 150, such as the metal oxide structure 150a. For example, a portion of the surface of the stop layer 130 exposed from the metal layer 340 may be oxidized in the oxidation process for forming the metal oxide structure 150a. In the embodiment, the material of the metal oxide structure 150a may include, for example, the oxide of the stop layer 130. For example, when the material of the stop layer 130 is TiN, and then the material of the metal oxide structure 150a may include TiON. In the present step, since the top surface 130a' of the stop layer 130 is below the top surface 340a of the metal layer 340, therefore, the top surface 150a-1 of the as-formed metal oxide structure 150a is below the top surface 140a of the metal oxide layer 140.

As such, the semiconductor structure 200 as shown in FIG. 5F (FIG. 2) is formed. In summary, the thickness T2 of the metal oxide layer 140 may be nicely adjusted and controlled by adjusting the depth D1 of the recess formed from the upper portion 110r of the via 110v, the thickness T1 of the stop layer 130, and the planarization process of the metal layer 340'. In addition, the above-mentioned processes further have advantages of compatibility with the current CMOS manufacturing process.

Referring to FIGS. 6A-6G, a manufacturing method of the semiconductor structure 300 according to a further embodiment of the disclosure is illustrated.

Figure 6A:
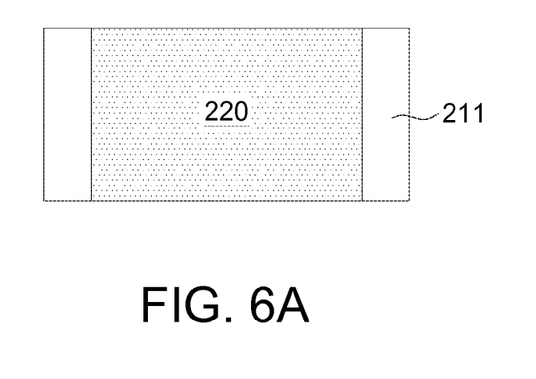
FIGS. 6A-6G illustrate a manufacturing method of a semiconductor structure according to a further embodiment of the disclosure.
Figure 6B:
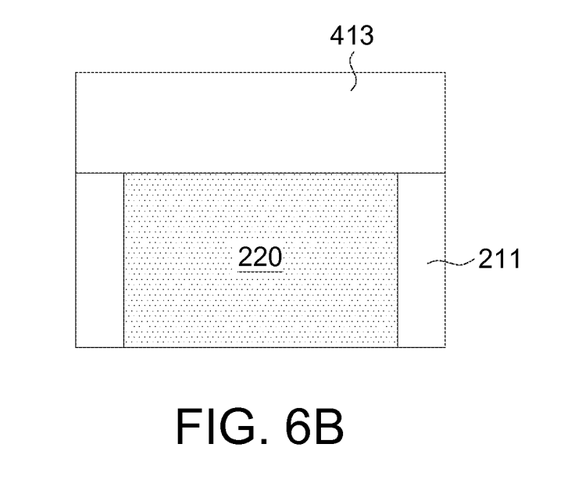
Figure 6C:
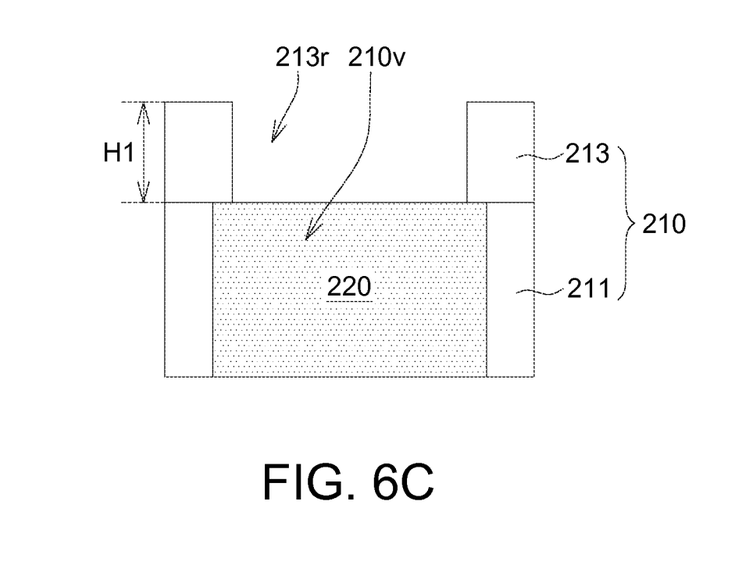

As shown in FIGS. 6A-6C, the insulating structure 210 having the via 210v is formed, and the conductive structure 220 is formed in the via 210v. The manufacturing method of forming the insulating structure 210 includes such as the following steps.

As shown in FIG. 6A, the spacer wall 211 is formed, wherein the conductive structure 220 is filled within the spacer wall 211 for the spacer wall 211 to surround the conductive structure 220.

In the embodiment, a liner layer (not shown in drawings) may be optionally formed between the conductive structure 220 and the insulating structure 210. For example, the liner layer is formed on the inner sidewalls of the insulating structure 210, followed by forming the conductive structure 220 on the liner layer.

Next, as shown in FIG. 6B, the interlayer dielectric material layer 413 is formed on the spacer wall 211 and on the conductive structure 220.

Then, as shown in FIG. 6C, a portion of the interlayer dielectric material layer 413 located on the conductive structure 220 is removed for forming the interlayer dielectric layer 213 on the spacer wall 211, wherein the spacer wall 211 together with the interlayer dielectric layer 213 forms the via 210v. In the embodiment, the portion of the interlayer dielectric material layer 413 located on the conductive structure 220 is removed by such as a photo/etching process for forming a through hole 213r. The through hole 213r penetrates through the interlayer dielectric layer 213 and connects to the conductive structure 220. In the embodiment, for example, the etching process is performed by using an etchant having a high selectivity to the interlayer dielectric material layer 413 and the conductive structure 220, such that only the interlayer dielectric material layer 413 is partially etched and removed, and the structure of the conductive structure 220 is not substantially damaged by the etching process. As shown in FIG. 6C, the through hole 213r corresponding to the interlayer dielectric layer 213 together with the space corresponding to the spacer wall 211 for placing the conductive structure 220 forms the via 210v of the insulating structure 210. In the embodiment, the interlayer dielectric layer 213 (through hole 213r) has a height H1 which is about the sum of the thicknesses of the stop layer and the metal oxide layer formed in the subsequent steps, for example, the height H1 may be 300-700 Å. However, the height H1 may vary according to actual needs, such as requirements of resistance or other characteristics of elements, and is not limited thereto.

In the present embodiment, the through hole 213r is further formed by depositing the interlayer dielectric layer 213. Since thin film deposition processes are provided with high controllability over uniformity of film thickness, as such, the height H1 of the through hole 213r has a high uniformity, and thus the thickness of the metal oxide layer 140 formed therewithin has a high uniformity. According to the embodiments of the present disclosure, the semiconductor structure 300 is such as a contact-type resistive random access memory unit structure, since the thickness of the insulating layer of the memory element has a high uniformity, the resistance of the memory element can thus be better controlled, and accordingly, the contact-type resistive random access memory unit structure is provided with improved characteristics.

Figure 6D:
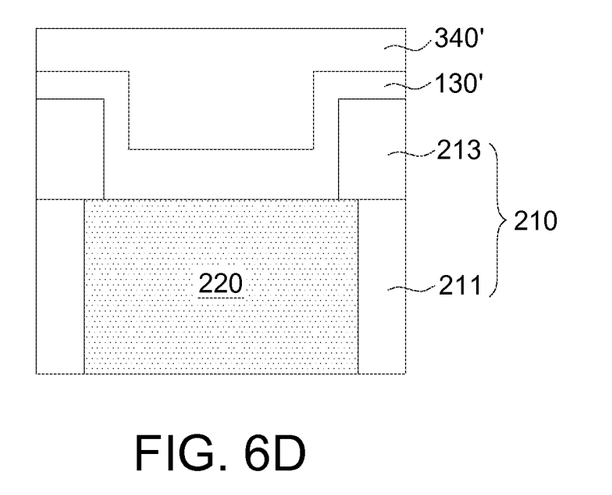

As shown in FIG. 6D, a stop layer 130' is formed on the conductive structure 220 and on the sidewall 110s of the via 110v, and a metal layer 340' is formed on the stop layer 130'. In the embodiment, for example, the stop layer 130' and the metal layer 340' are formed and filled in the through hole 213r.

Figure 6E:
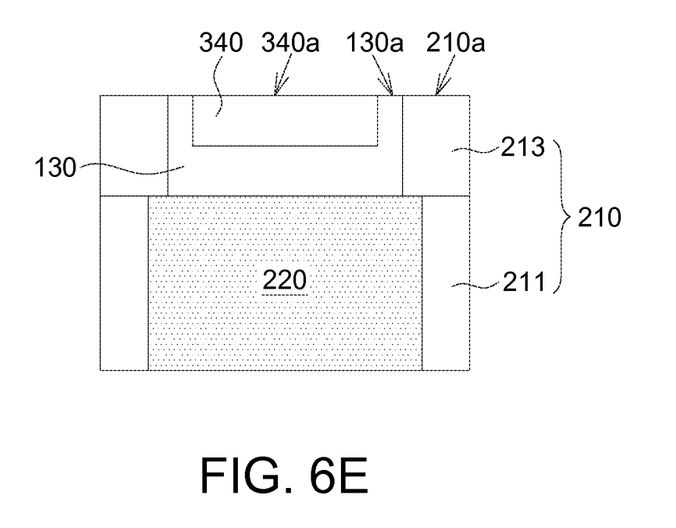

As shown in FIG. 6E, a planarization process is performed on the stop layer 130' and the metal layer 340' for planarizing the surfaces of the stop layer 130' and the metal layer 340', for forming the stop layer 130 and the metal layer 340. In the embodiment, the planarization process is such as a CMP process. After the planarization, as shown in FIG. 6E, the top surface 130a of the stop layer 130 and the top surface 340a of the metal layer 340 are coplanar and aligned with each other. After the planarization, the top surface 130a of the stop layer 130 and the top surface 340a of the metal layer 340 may be either coplanar and aligned with the top surface 210a of the insulating structure 210 or non-coplanar with the top surface 210a. In the embodiment, as shown in FIG. 6E, the top surface 130a and the top surface 340a are coplanar with the top surface 210a of the insulating structure 210.

Figure 6F:
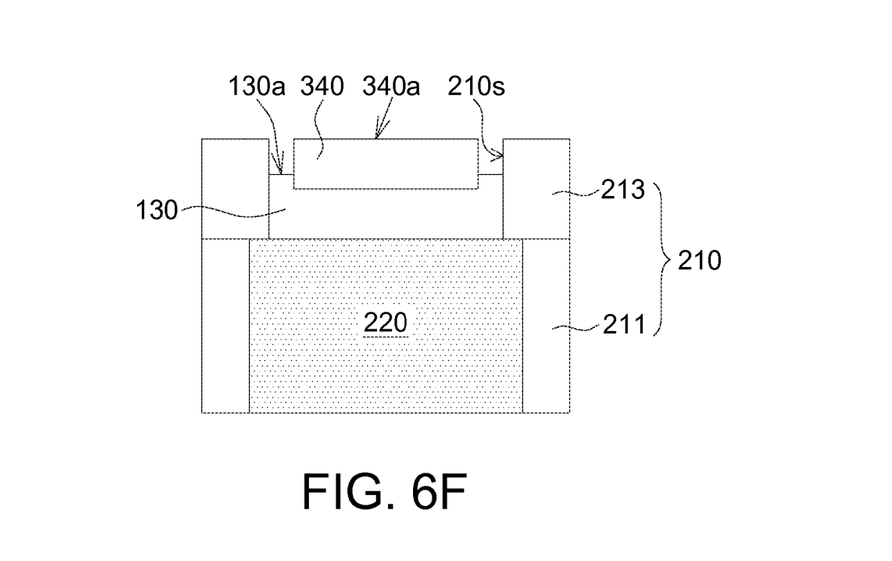

As shown in FIG. 6F, a portion of the stop layer 130 located on the sidewall 210s of the via 210v is removed. After the step, the top surface 130a' of the stop layer 130 and the top surface 340a of the metal layer 340 are non-coplanar. In the embodiment, the portion of the stop layer 130 is removed by such as an etching process using an etchant having a high selectivity to the stop layer 130 and the metal layer 340, such that only the stop layer 130 is partially removed, and the structure of the metal layer 340 is not substantially damaged by the etching process.

Figure 6G:
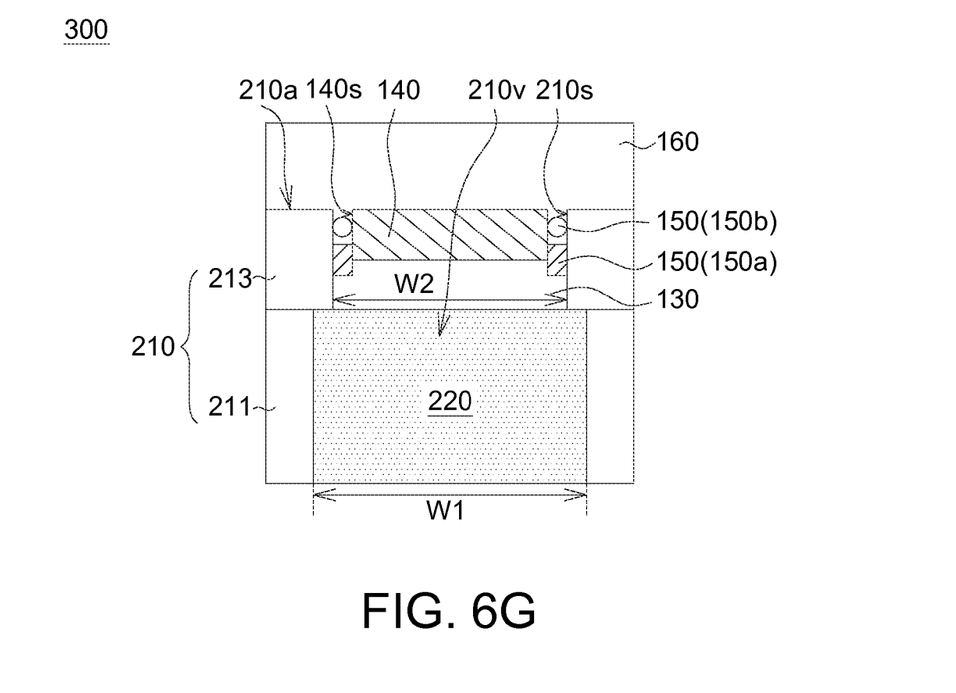

As shown in FIG. 6G, an oxidation process is performed for oxidizing the metal layer 340 for forming the metal oxide layer 140 on the stop layer 130 and for forming the resistance structure 150 at the bottom of the outer wall 140s of the metal oxide layer 140, and the electrode material layer 160 is formed on the metal oxide layer 140. In the embodiment, the stop layer 130 can prevent oxygen from penetrating through, such that the oxidation of the metal layer 340 can be stopped on top of the stop layer 130, and the oxidation does not extend downwards to the conductive structure 220. As such, the thickness of the metal oxide layer 140 can be better controlled, and the thickness of the metal oxide layer 140 is more uniform.

In the embodiment, as shown in FIG. 6G, the electrode material layer 160 may be formed on the top surface 210a of the insulating structure 210 as well.

In the oxidation process, the metal layer 340 is oxidized and expands in volume, and the metal oxide layer 140 as shown in FIG. 6G is thus formed, wherein the outer wall 140s of the expanded metal oxide layer 140 extends towards the sidewall 210s of the via 210v. In addition, the resistance structure 150, such as the void 150b, may be formed between the outer wall 140s of the metal oxide layer 140 and the sidewall 210s of the via 210v. In the embodiment, for example, the void 150b is formed at the bottom of the outer wall 140s of the metal oxide layer 140.

Moreover, in the oxidation process, an exposed portion of the stop layer 130 may be oxidized as well for forming the resistance structure 150, such as the metal oxide structure 150a. For example, a portion of the surface of the stop layer 130 exposed from the metal layer 340 may be oxidized in the oxidation process for forming the metal oxide structure 150a. In the embodiment, the material of the metal oxide structure 150a may include, for example, the oxide of the stop layer 130. For example, when the material of the stop layer 130 is TiN, and then the material of the metal oxide structure 150a may include TiON.

As such, the semiconductor structure 200 as shown in FIG. 6G (FIG. 3) is formed. In summary, the thickness T2 of the metal oxide layer 140 may be nicely adjusted and controlled by adjusting the height H1 of the interlayer dielectric layer 213, the thickness T1 of the stop layer 130, and the planarization process of the metal layer 340'. In addition, the above-mentioned processes further have advantages of compatibility with the current CMOS manufacturing process.

Figure 7:
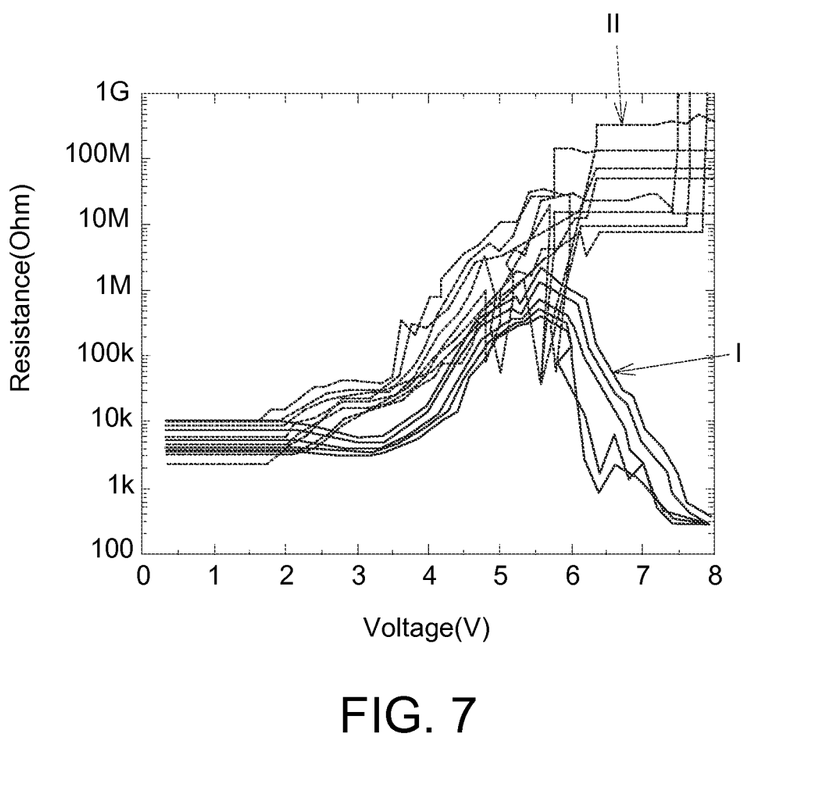
FIG. 7 shows resistance-voltage curves of semiconductor structures according to embodiments and comparative embodiments of the disclosure.

FIG. 7 shows resistance-voltage curves of semiconductor structures according to embodiments and comparative embodiments of the disclosure. In the embodiments, taking the semiconductor structure 100 as an example, after a portion of the stop layer 130 on the sidewalls 110s of the via 110a is removed, the resistance structure 150 (e.g. the metal oxide structure 150a and the void 150b) is formed at the bottom of the outer wall 140s of the metal oxide layer 140 in the following oxidation process. In contrast, in the comparative embodiments, the process of removing a portion of the stop layer 130 on the sidewalls 110s of the via 110a is not performed on the semiconductor structure; therefore, only the top surface of the stop layer 130 is oxidized in the oxidation process, and the oxidized top surface of the stop layer 130 is coplanar with the top surface of the metal oxide layer 140. As such, it is impossible for a resistance structure 150 to be formed at the bottom of the outer wall 140s of the metal oxide 140 in the semiconductor structure of the comparative embodiments. Compared to the semiconductor structure according to the comparative embodiments, which only has a thin oxide layer on the top surface of the stop layer 130, the resistance structure 150 of the semiconductor structure 100 according to the embodiments has a bigger depth, which can isolate the electrode material layer 160 from the conductive structure 120 more effectively, reduce the electrical interference between the electrode material layer 160 and the conductive structure 120, and further increase the breakdown voltage of the semiconductor structure 100 according to the embodiments.

As shown in FIG. 7, the curve I represents the resistance-voltage curve of the semiconductor structure of the comparative embodiments, and the curve II represents the resistance-voltage curve of the semiconductor structure of the embodiments. As shown in FIG. 7, the semiconductor structure of the comparative embodiments has a breakdown voltage of about 5.5-6 V, while the semiconductor structure of the embodiments has a breakdown voltage of at least 8 V or higher, which is far higher than that of the semiconductor structure of the comparative embodiments.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    an insulating structure having a via;
    a stop layer formed in the via;
    a metal oxide layer formed on the stop layer;
    a resistance structure formed at a bottom of an outer wall of the metal oxide layer, wherein a top surface of the resistance structure is below a top surface of the metal oxide layer; and
    an electrode material layer formed on the metal oxide layer.

2. The semiconductor structure according to claim 1, further comprising:
    a conductive structure formed in the via, wherein the stop layer is formed on the conductive structure.

3. The semiconductor structure according to claim 1, wherein the resistance structure comprises at least one of a metal oxide structure or a void.

4. The semiconductor structure according to claim 1, wherein the insulating structure comprises:
    a spacer wall surrounding the conductive structure; and
    an interlayer dielectric layer formed on the spacer wall, wherein the spacer wall together with the interlayer dielectric layer forms the via.

5. The semiconductor structure according to claim 4, wherein the via has a first width corresponding to the spacer wall, the via has a second width corresponding to the interlayer dielectric layer, and the first width is different from the second width.

6. The semiconductor structure according to claim 1, wherein the stop layer has a thickness of 200-300 Å, and the metal oxide layer has a thickness of 100-400 Å.

7. The semiconductor structure according to claim 1, wherein the stop layer comprises at least one of a metal nitride or an inert metal.

8. A resistive random access memory unit structure, comprising:
    an insulating structure having a via;
    a stop layer formed in the via;
    a memory element formed on the stop layer;
    a resistance structure formed at a bottom of an outer wall of the memory element, wherein a top surface of the resistance structure is below a top surface of the memory element; and
    a top electrode layer formed on the memory element.

9. The resistive random access memory unit structure according to claim 8, further comprising:
    a contact structure formed in the via, wherein the stop layer is formed on the contact structure.

10. The resistive random access memory unit structure according to claim 8, wherein the resistance structure comprises at least one of a metal oxide structure or a void.

11. The resistive random access memory unit structure according to claim 8, wherein the insulating structure comprises:
    a spacer wall surrounding the contact structure; and
    an interlayer dielectric layer formed on the spacer wall, wherein the spacer wall together with the interlayer dielectric layer forms the via.

12. The resistive random access memory unit structure according to claim 8, wherein the stop layer comprises at least one of a metal nitride or an inert metal.

* * * * *